United States Patent
Huang et al.

(10) Patent No.: US 7,881,241 B2
(45) Date of Patent: Feb. 1, 2011

(54) DYNAMICAL SEQUENTIALLY-CONTROLLED LOW-POWER MULTIPLEXER DEVICE

(75) Inventors: Juinn-Dar Huang, Hsinchu County (TW); Chia-I Chen, Taipei (TW)

(73) Assignee: National Chiao Tung University, Hsinchu (TW)

( * ) Notice: Subject to any disclaimer, the term of this patent is extended or adjusted under 35 U.S.C. 154(b) by 893 days.

(21) Appl. No.: 11/808,130

(22) Filed: Jun. 6, 2007

(65) Prior Publication Data

US 2008/0198784 A1    Aug. 21, 2008

(51) Int. Cl.
*G08C 17/00* (2006.01)
(52) U.S. Cl. .................. 370/311; 370/537; 370/538; 370/539; 370/540; 370/541
(58) Field of Classification Search ................ 370/311, 370/503, 539, 537, 538, 540, 541, 532
See application file for complete search history.

(56) References Cited

U.S. PATENT DOCUMENTS

| | | | |
|---|---|---|---|
| 5,311,519 A * | 5/1994 | Getzlaff et al. | 370/541 |
| 6,054,877 A | 4/2000 | Ventrone | 326/105 |
| 6,105,139 A | 8/2000 | Dey et al. | 713/300 |
| 6,492,835 B2 | 12/2002 | Shau | 326/41 |
| 6,657,979 B1 * | 12/2003 | Patel et al. | 370/318 |
| 6,760,349 B1 * | 7/2004 | Ho et al. | 370/537 |
| 7,111,151 B2 | 9/2006 | Moore et al. | 712/212 |
| 7,114,086 B2 | 9/2006 | Mizuyabu et al. | 713/320 |
| 7,126,319 B2 | 10/2006 | Chen | 323/313 |
| 7,554,487 B2 * | 6/2009 | Abraham et al. | 342/357.02 |
| 7,697,572 B2 * | 4/2010 | Smelquist et al. | 370/503 |
| 2003/0063626 A1 * | 4/2003 | Karlquist | 370/503 |
| 2003/0202545 A1 * | 10/2003 | Arbel et al. | 370/539 |
| 2004/0003123 A1 * | 1/2004 | Kwon | 709/248 |
| 2006/0123365 A1 * | 6/2006 | Hoberman et al. | 716/4 |

OTHER PUBLICATIONS

Unni Narayanan, Hon Wai Leong, Ki-Seok Chung and C.L. Liu, "Low Power Multiplexer Decomposition", ACM 0-89791-903-3/97/08, 1997, pp. 269-274.
Kisun Kim, Taekyoon Ahn, Sang-Yeol Han, Chang-Seung Kim and Ki-Hyun Kim, "Low-Power Multiplexer Decomposition by Suppressing Propagation of Signal Transitions", IEEE, 0-7803-6685-9/01, 2001, pp. V-85-V088.

* cited by examiner

*Primary Examiner*—Charles N Appiah
*Assistant Examiner*—Michael T Vu
(74) *Attorney, Agent, or Firm*—Muncy, Geissler, Olds & Lowe, PLLC

(57) ABSTRACT

Multiplexers are basic components widely used in VLSI designs. Switching activities of a multiplexer are one of the most important factors of power consumption. A multiplexer may have some sub-multiplexers. An extra dynamic controller is applied in the present invention to reconfigure control signals for decreasing switching activities of the composed sub-multiplexers. Thus, the power consumption of the multiplexer is reduced to achieve higher power efficiency.

7 Claims, 8 Drawing Sheets

DYNAMICAL SEQUENTIALLY-CONTROLLED LOW-POWER MULTIPLEXER DEVICE

FIELD OF THE INVENTION

The present invention relates to a multiplexer; more particularly, relates to reducing switching activities in the multiplexer for saving power and achieving higher power efficiency through analyzing control signals.

DESCRIPTION OF THE RELATED ARTS

On designing electric devices, multiplexers are widely used. Owing to frequent switching activities in the multiplexers, a lot of power is consumed. Since mobile equipments and hand held devices are on the hot, power consumption is a critical concern on designing the mobile equipments. Because the formula for dynamic power consumption is $P=\alpha CV^2 f$, methods to save power are no other than reducing load capacitance (C), lowering working voltage (V), decreasing working frequency (f) and abating switching activity ($\alpha$). As shown in FIG. 7, for example, a traditional eight-to-one multiplexer needs the first control line [71] (CS1), the second control line [72] (CS2) and the third control line [74] (CS3), where the first control line [71] inputs signals to the first subordinate multiplexer [61] (MUX1), the second subordinate multiplexer [62] (MUX2), the third subordinate multiplexer [63] (MUX3) and the fourth subordinate multiplexer [64] (MUX4); the second control line [72] inputs signals to the fifth subordinate multiplexer [65] (MUX5) and the sixth subordinate multiplexer [66] (MUX6); and the third control line [73] inputs signals to the seventh subordinate multiplexer [67] (MUX7). When a control signal value 000 is inputted followed by another control signal value 101, the first control line [71] inputs a signal 0 and then changes it into 1, where all of the first subordinate multiplexer [61], the second subordinate multiplexer [62], the third subordinate multiplexer [63] and the fourth subordinate multiplexer [64] are affected; the second control line [72] does nothing; and the third control line [73] inputs a signal 0 and then changes it in to 1, where the seventh subordinate multiplexer [67] is affected. Hence, in a simple change of control signal from 000 to 101, a total number of five subordinate multiplexers are affected, where the switching activities of the whole multiplexer is too high.

There are some prior arts concerning the relationship between the multiplexers and the control signals; yet, they are all static analysis on characteristics of the control signals in order to achieve low-power consumption.

Such as, a prior art is U.S. Pat. No. 6,657,979, "Reduced Power Consumption Multiplexer Using Self-Decoding Power Down Logic" by L. O. Patel, W. O. Mathes and K. Jurek, 2003. Subordinate multiplexers in a main multiplexer are replaced with multiplexer output cells and multiplexer input cells. Logic rules are executed with control signals and the signals passed between the multiplexer output cells and the multiplexer input cells, where only those multiplexer output cells and multiplexer input cells on the signal path consume power. In this way, those unaffected subordinate multiplexers do not consume power and thus the power consumed by the whole multiplexer is saved. However, the complexity of the replacing multiplexer output cells and multiplexer input cells is thus increased. In addition, because the logic rules are integrated in the multiplexer output cells and the multiplexer input cells, other power-saving technologies applied in the multiplexers become un-applicable.

Another prior art is U.S. Pat. No. 6,105,139, "Controller-Based Power Management for Low-Power Sequential Circuits" by S. Dey, A. Raghunathan and N. K. Jha, 2000. Input signals, a circuit structure and control signals of a sequential circuit are analyzed in the prior art for their dependencies and functionalities. And the control logic and the circuit structure are reconfigured and re-designate according to the analysis to reduced unnecessary switching activities of components in the circuit structure for saving power consumption. However, such a method is not always cost effective. Once the circuit is changed a little bit, reanalysis, reconfiguration and re-designation are all required. At the same time, because the circuit structure is thus changed, examination has to be done and the method becomes complex.

The above prior arts analyze selection-probability and on-probability to change control signals for saving power consumption of a multiplexer. Yet the power saved is limited or the cost effectiveness is not satisfied. Hence, the prior arts do not fulfill all users' requests on actual use.

SUMMARY OF THE INVENTION

The main purpose of the present invention is to change control signals through analysis for reducing switching activities in a multiplexer for saving power consumption of the multiplexer and thus obtaining high power efficiency.

To achieve the above purpose, the present invention is a dynamic sequentially-controlled low-power multiplexer device, comprising a many-to-one multiplexer element comprising a plurality of subordinate multiplexer; and a dynamic controller, where each subordinate multiplexer or each group of subordinate multiplexers has its own control signals; and where switching activities in the multiplexer are reduced through analyzing control signals for saving power and thus obtaining high power efficiency. Accordingly, a novel dynamic sequentially-control led low-power multiplexer device is obtained.

BRIEF DESCRIPTIONS OF THE DRAWINGS

The present invention will be better understood from the following detailed descriptions of the preferred embodiments according to the present invention, taken in conjunction with the accompanying drawings, in which FIG. 1 is the view showing the structure according to the present invention;

DESCRIPTIONS OF THE PREFERRED EMBODIMENTS

The following descriptions of the preferred embodiments are provided to understand the features and the structures of the present invention.

Figure 1:
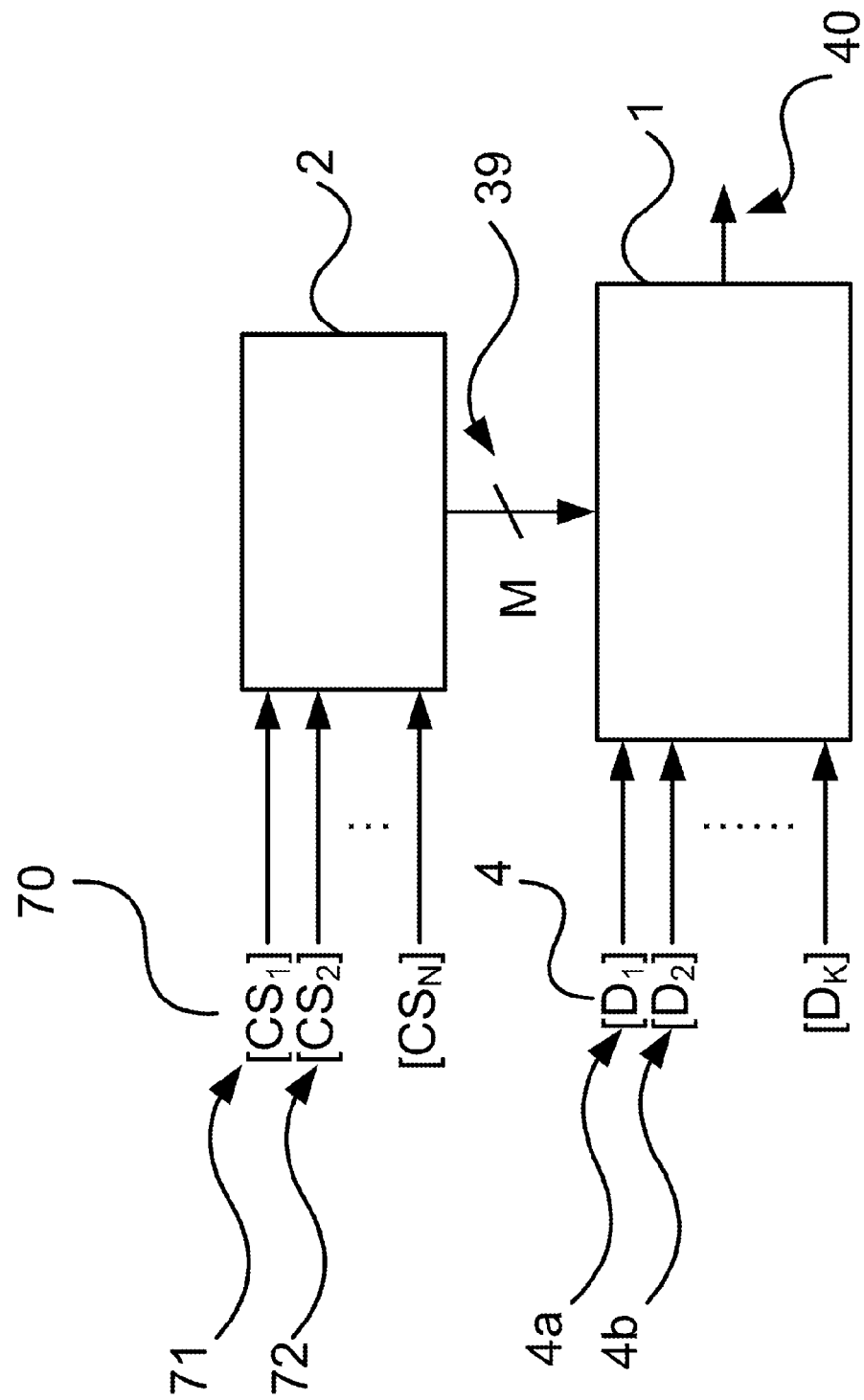
Figure 2:
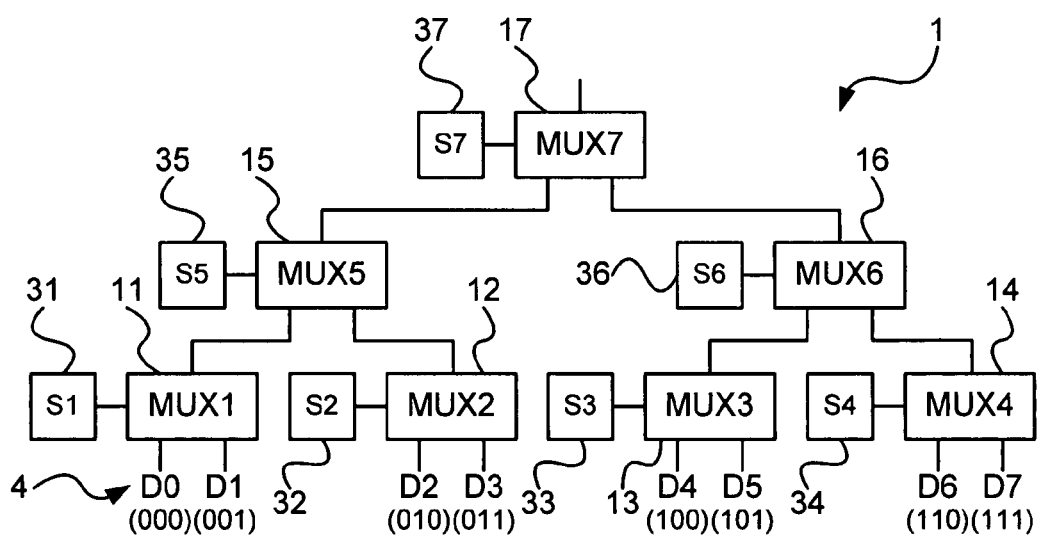
FIG. 2 is the view showing the first multiplexer element.
Figure 3:
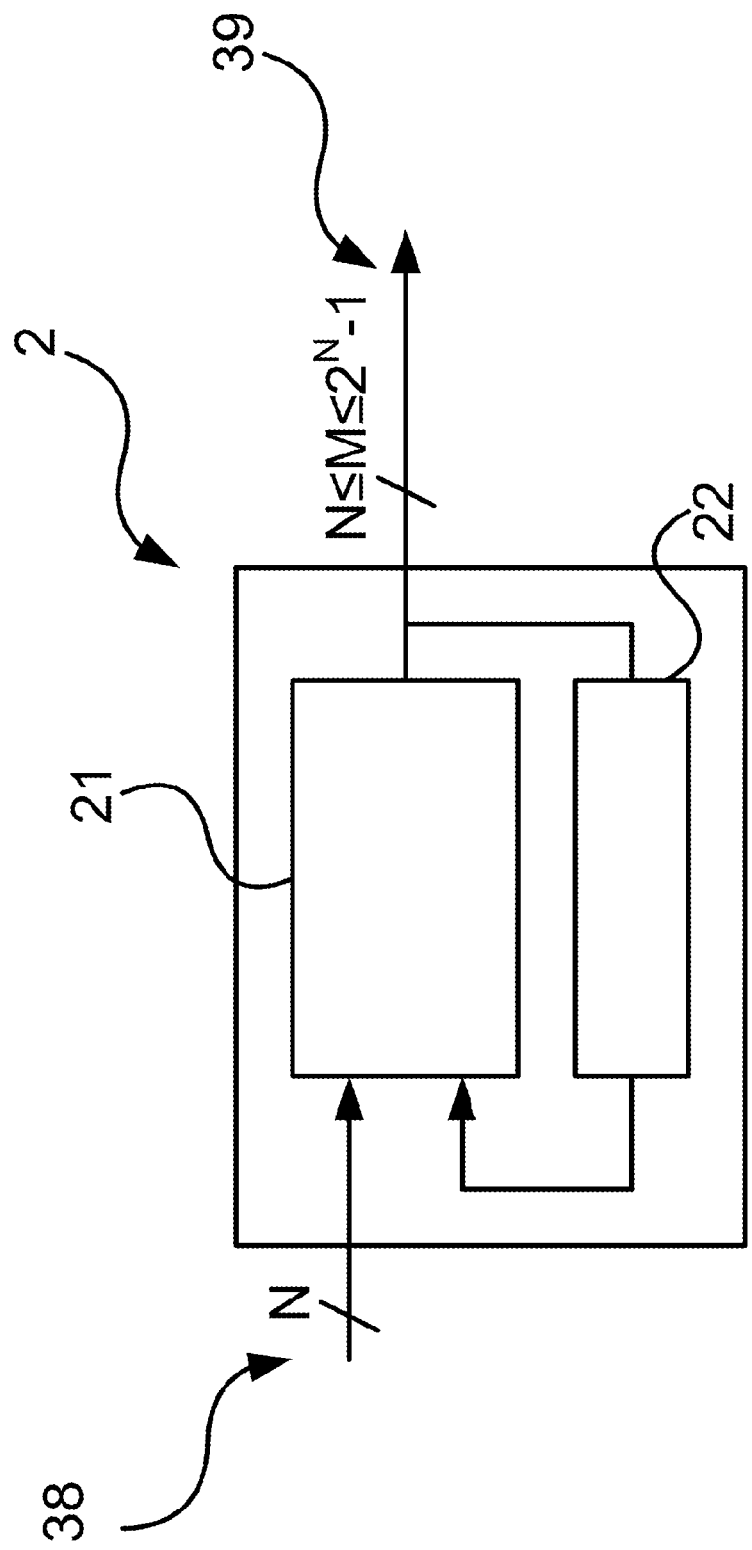
FIG. 3 is the view showing the first dynamic controller.

Please refer to FIG. 1 to FIG. 3, which are views showing a structure, the first multiplexer element and the first dynamic controller according to the present invention. The present invention is a dynamic sequentially-controlled low-power multiplexer device, comprising a many-to-one multiplexer element [1] and a dynamic controller [2], where a power consumption of the multiplexer element [1] outputting a output signal [40] is reduced and thus the power efficiency of the whole multiplexer device is improved.

The many-to-one multiplexer element [1] comprises a plurality of subordinate multiplexers [11~17], where the subordinate multiplexer [11~17] is a two-to-one multiplexer, a four-to-one multiplexer, or a multiplexer provided by a cell library. The subordinate multiplexers [11~17] are grouped into N to $2^{N-1}$ groups to use different control lines according to different characteristics of the subordinate multiplexers [11~17], where N is a bit number. Each of the subordinate multiplexers [11~17] is a combination of logic gates, where the logic gate is an AND logic gate, an OR logic gate, a NOT logic gate, a NAND logic gate, a NOR logic gate or other elementary logic gates.

As shown in FIG. 3, the dynamic controller [2] is a sequential circuit, comprising a combinational circuit [21], which comprises logic elements, and registers/latches [22], which are memory elements. The combinational circuit [21] is inputted with control signals from an N number of control lines [70]. After the control signals are inputted into the combinational circuit [21], new control signals are outputted from an M number of control lines to dynamically determine switching activities of the subordinate multiplexers [11~17].

When using the present invention, the dynamic controller [2] works with the many-to-one multiplexer element [1] at the outside of the multiplexer element [1]. The inputted control signals [38] are inputted into the dynamic controller [2] first for obtaining new outputted control signals [39] to control the subordinate multiplexers [11~17] in the multiplexer element [1] so that switching activities in the multiplexer element [1] are reduced and power consumed by the multiplexer element [1] is thus saved.

An example of an eight-to-one multiplexer element [1] is obtained, as shown in FIG. 2. The first subordinate multiplexer [11] (MUX1), the second subordinate multiplexer [12] (MUX2), the third subordinate multiplexer [13] (MUX3), the fourth subordinate multiplexer [14] (MUX4), the fifth subordinate multiplexer [15] (MUX5), the sixth subordinate multiplexer [16] (MUX6) and the seventh subordinate multiplexer [17] (MUX7) are connected with the first control line [31] (S1), the second control line [32] (S2), the third control line [33] (S3), the fourth control line [34] (S 4), the fifth control line [35] (S 5), the sixth control line [36] (S6) and the seventh control line [37] (S7), respectively. When control signals change from 000 to 101, only three of the subordinate multiplexers are influenced, including the seventh subordinate multiplexer [17], the sixth subordinate multiplexer [16] and the third subordinate multiplexer [13]. Yet, only the seventh subordinate multiplexer [17] is crucial to the control-signal change from 000 to 101. Hence, the only subordinate multiplexer that must be switched is the seventh subordinate multiplexer [17]; and, whether the sixth subordinate multiplexer [16] and the third subordinate multiplexer [13] are required to be switched is determined according to their original states. Thus, a power consumption of the multiplexer element [1] is saved while at least one and at most three subordinate multiplexers are switched.

Figure 4A:
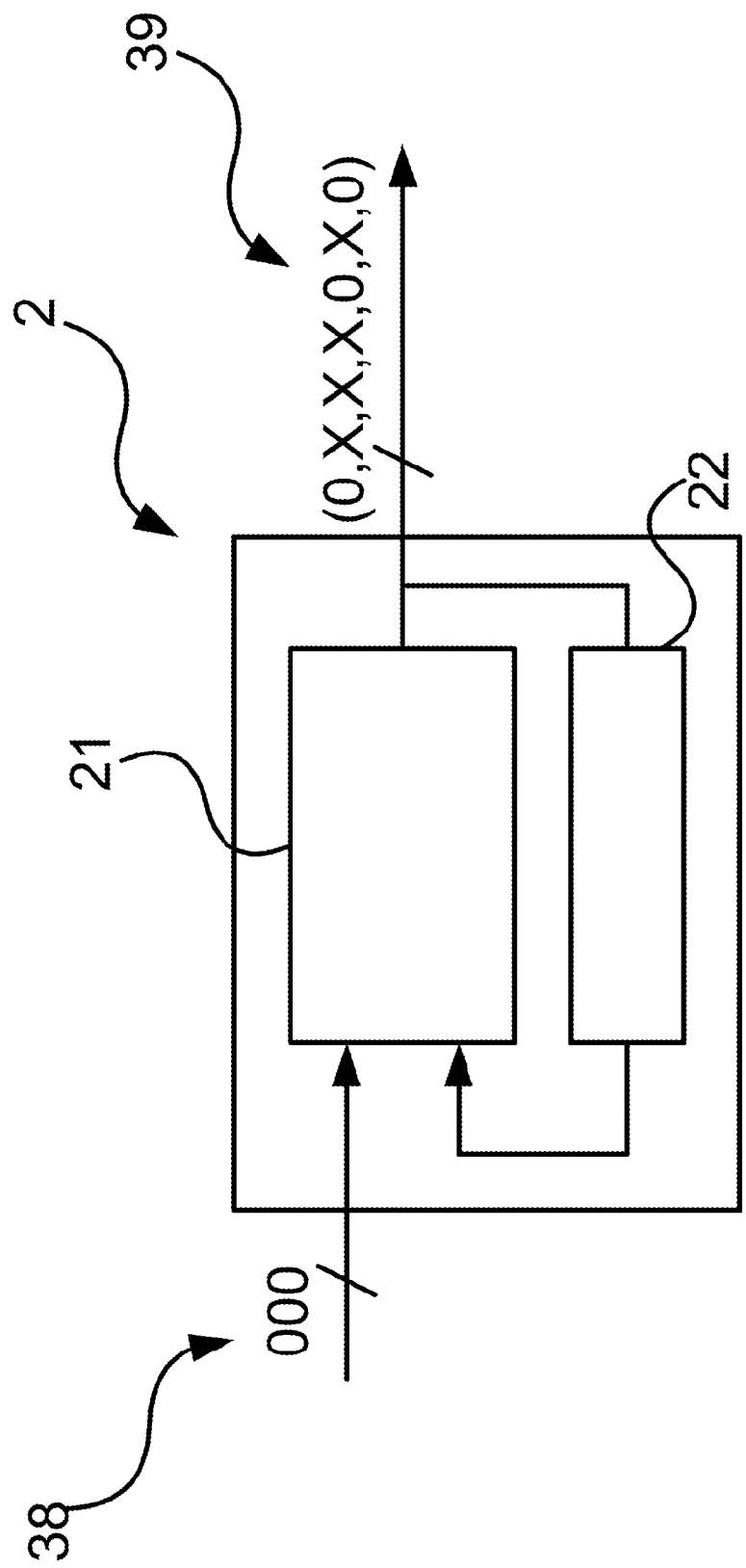
FIG. 4A is the view showing the first run of the dynamic controller.
Figure 4B:
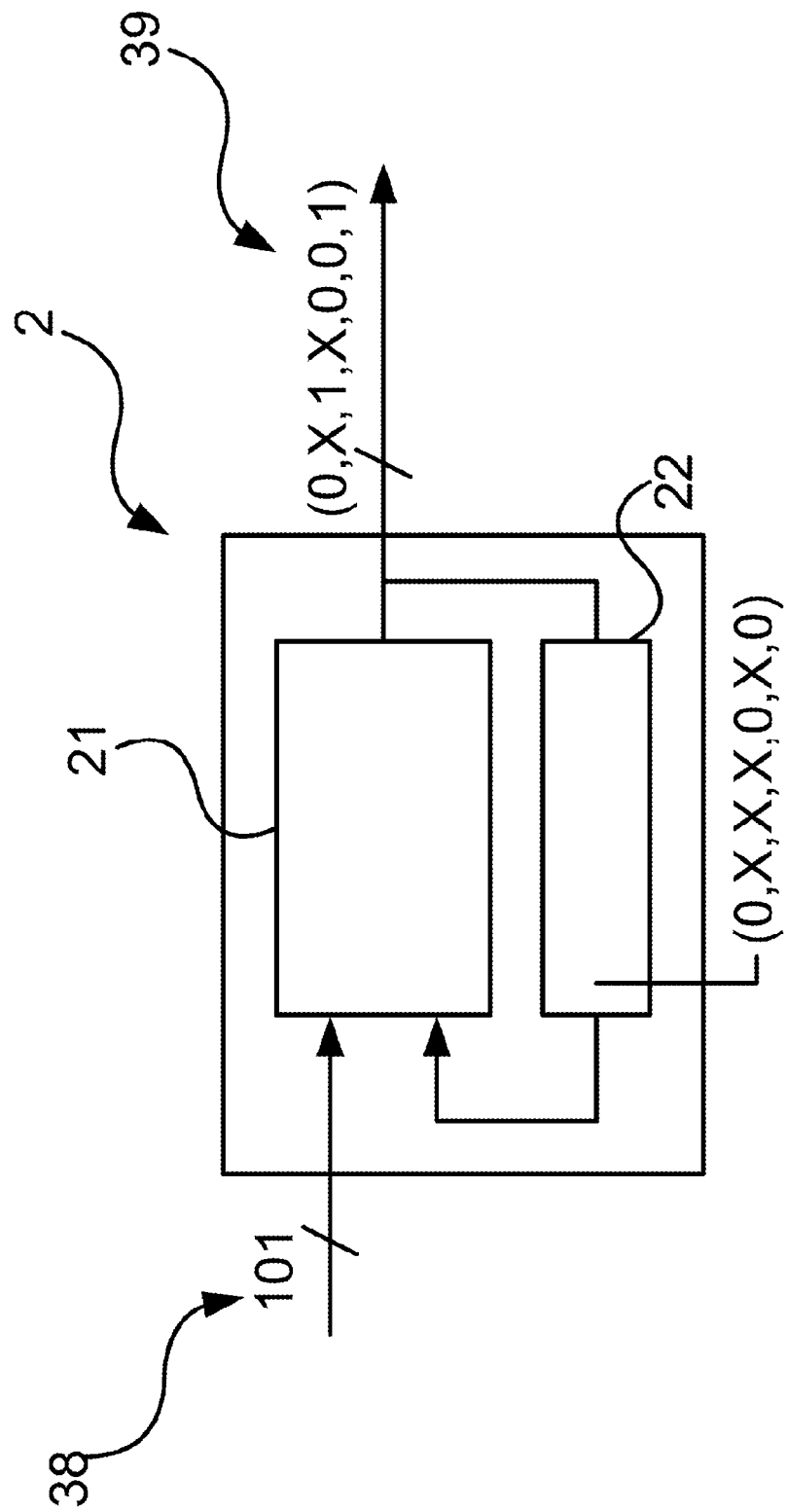
FIG. 4B is the view showing the second run of the dynamic controller.

Please further refer to FIG. 4A and FIG. 4B, which are views showing the first run and the second run of a dynamic controller. As shown in the figures, at first, the registers [22] have default values or values left by a previous run; and, control signals of 000 are inputted, and then the combinational circuit [21] outputs (0, X, X, X, 0, X, 0). Therein, the signals outputted are control signals, and are inputted through the first control line [31] to the seventh control line [37] (S1~7) into the first subordinate multiplexer [11] to the seventh subordinate multiplexer [17] (MUX1~MUX7), respectively. Hence, (0, X, X, X, 0, X, 0) means that values of the first subordinate multiplexer [11] (MUX1), the fifth subordinate multiplexer [15] (MUX5) and the seventh subordinate multiplexer [17] (MUX7) have to be zeros, and values of the other multiplexers, represented as X, do not matter.

Control signals following 000 are 101, as shown in FIG. 4B. The registers [22] have values of (0, X, X, X, 0, X, 0) left by the previous run. Then the combinational circuit [21] outputs (0, X, 1, X, 0, 0, 1) according to the input 101. It means that values of the third subordinate multiplexer [13] (MUX3), the sixth subordinate multiplexer [16] (MUX6) and the seventh subordinate multiplexer [17]MUX7) have to be 1, 0 and 1, respectively; the values of the first subordinate multiplexer [11] (MUX1), the fifth subordinate multiplexer [15] (MUX5) have to be zeros; and values of the other multiplexers, represented as X, do not matter. Thus, the input process of the control signals of 000 following with the control signals of 101 is done.

Figure 5:
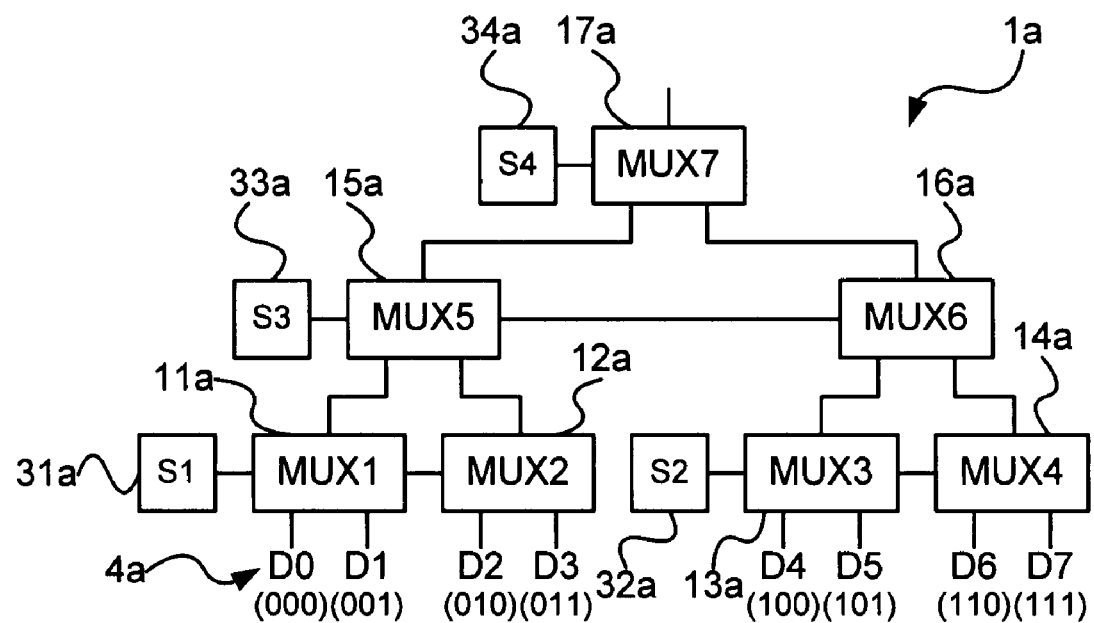
FIG. 5 is the view showing the second multiplexer element.
Figure 6:
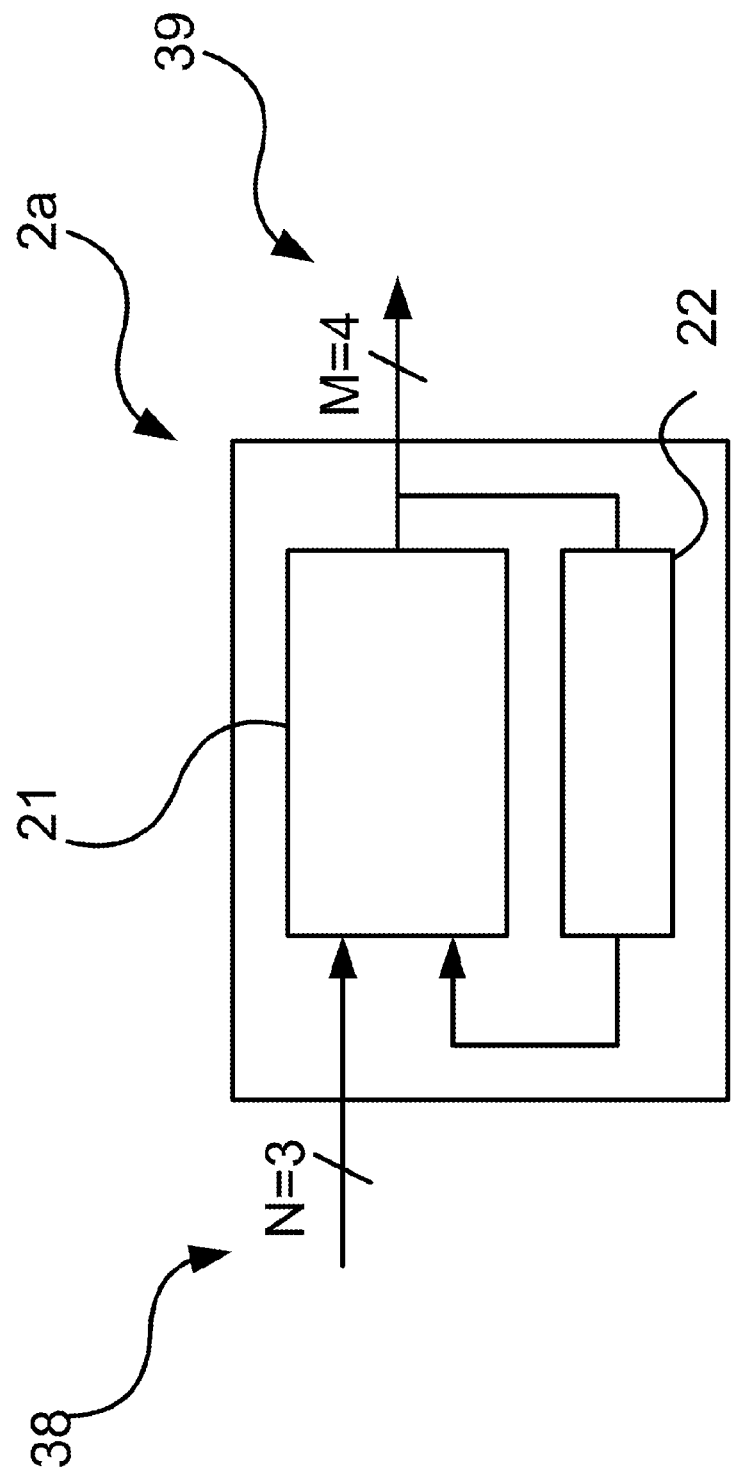
FIG. 6 is the view showing the second dynamic controller.
Figure 7:
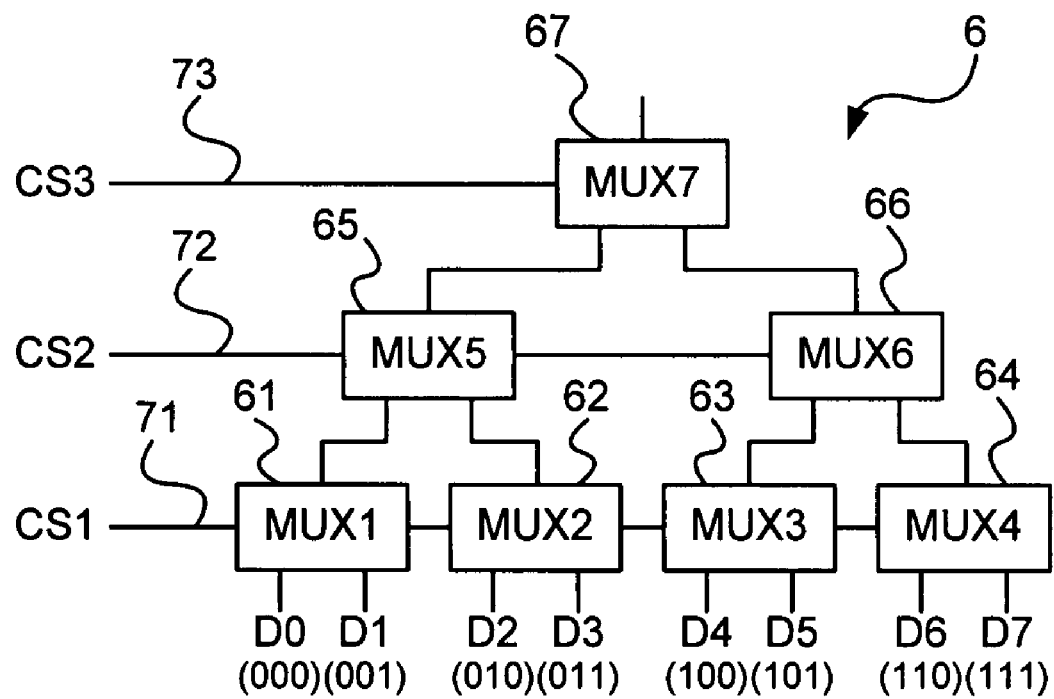
FIG. 7 is the view of the prior art of multiplexer element.

Please refer to FIG. 5 and FIG. 6, which are views showing the second multiplexer element and the second dynamic controller. As shown in the figures, according to actual requirements, not each of the subordinate multiplexers, including two-to-one multiplexers, four-to-one multiplexers or other multiplexers provided by cell libraries, needs its own control line. The dynamic controller [2] outputs outputted control signals [39] to subordinate multiplexers [11a~17a] from M control lines [31a~34a], where $N \leq M \leq 2^N-1$ and N is a bit number of the control signals (N=3, for example). Hence, if M equals N, the subordinate multiplexers [31a-34a] act just as traditional multiplexers having no dynamic controller (as shown in FIG.7). In reality, according to the characteristics of the data signals 4, including data signals [4a] and data signals [4b] (D1~D7), like selection-probability and on-probability, some multiplexers are grouped together after analysis to use the same control line. Such as what is shown in FIG. 5, the first subordinate multiplexer [11 a] and the second subordinate multiplexer [12a] are grouped to use a first control line [31a]; the third subordinate multiplexer [13a] and the fourth subordinate multiplexer [14a] are grouped to use the second control line [32a]; the fifth subordinate multiplexer [15a] and the sixth subordinate multiplexer [16a] are grouped to use the third control line [33a]; and the seventh subordinate multiplexer [17a] uses the fourth control line [34a] (M=4). Then the subordinate multiplexers [11a~17a] are coordinated with a dynamic controller [2a], where a complexity of the dynamic controller [2a] is reduced and a balance between circuit cost and power consumption is obtained.

As is known, data are usually inputted into a multiplexer through a bus. Hence, the larger bit number the data has, the more power is consumed on changing data. However, a dynamic controller consumes less power as compared to power consumed by the multi-bit data bus. Moreover, the extra power consumption of the dynamic controller would be nearly constant as the number of data bits increases. That is, the dynamic controller applied in the present invention saves power regard less of its own power consumption.

To sum up, the present invention is a dynamic sequentially-control led low-power multiplexer device, where, through considering control signals, switching activities in the multiplexer devices are reduced and power is thus saved.

The preferred embodiments herein disclosed are not intended to unnecessarily limit the scope of the invention. Therefore, simple modifications or variations belonging to the equivalent of the scope of the claims and the instructions disclosed herein for a patent are all within the scope of the present invention.

What is claimed is:

1. A dynamic sequentially-controlled low-power multiplexer device, comprising:
a many-to-one multiplexer element, said many-to-one multiplexer element comprising a plurality of subordinate multiplexers; and
a dynamic controller, said dynamic controller determining switches of said subordinate multiplexers,
wherein said subordinate multiplexers are grouped to use different control lines according to different characteristics of said subordinate multiplexers,
wherein said subordinate multiplexers are grouped into a number of groups between N and $2^{N-1}$ and said N is a bit number.

2. The multiplexer device according to claim 1,
wherein said subordinate multiplexer is selected from a group consisting of a two-to-one multiplexer, a four-to-one multiplexer, and a multiplexer provided by a cell library.

3. The multiplexer device according to claim 1,
wherein each of said subordinate multiplexer is a combination of logic gates; and
wherein said logic gate is an elementary logic gate selected from a group consisting of an AND logic gate, an OR logic gate, a NOT logic gate, a NAND logic gate and a NOR logic gate.

4. The multiplexer device according to claim 1,
wherein said dynamic controller is a sequential circuit.

5. The multiplexer device according to claim 4,
wherein said dynamic controller comprises a combinational circuit and registers/latches.

6. The multiplexer device according to claim 5,
wherein said combinational circuit comprises logic elements.

7. The multiplexer device according to claim 5,
wherein said registers/latches are memory elements.

* * * * *